(12) United States Patent
Li et al.

(10) Patent No.: US 12,217,996 B2
(45) Date of Patent: Feb. 4, 2025

(54) CONVEYING DEVICE (71) Applicant: SHINKAWA LTD., Tokyo (JP)

(72) Inventors: Jin Li, Tokyo (JP); Hiroshi Kikuchi, Tokyo (JP); Satoshi Enokido, Tokyo (JP)

(73) Assignee: SHINKAWA LTD., Tokyo (JP)

(*) Notice: Subject to any disclaimer, the term of this patent is extended or adjusted under 35 U.S.C. 154(b) by 673 days.

(21) Appl. No.: 17/603,934

(22) PCT Filed: Apr. 13, 2020

(86) PCT No.: PCT/JP2020/016291
§ 371 (c)(1),
(2) Date: Oct. 14, 2021

(87) PCT Pub. No.: WO2020/213566
PCT Pub. Date: Oct. 22, 2020

(65) Prior Publication Data
US 2022/0216089 A1 Jul. 7, 2022

(30) Foreign Application Priority Data
Apr. 15, 2019 (JP) .................................. 2019-076885

(51) Int. Cl.
*H01L 21/683* (2006.01)
*H01L 21/677* (2006.01)

(52) U.S. Cl.
CPC ........ *H01L 21/6838* (2013.01); *H01L 21/677* (2013.01)

(58) Field of Classification Search
CPC ............ H01L 21/6838; H01L 21/68721; B25J 15/0616; B65G 49/065
(Continued)

(56) References Cited

U.S. PATENT DOCUMENTS 4,921,520 A * 5/1990 Carlomagno ......... C03B 23/035
65/273
7,823,941 B2 * 11/2010 Caldwell ............... B66C 1/0262
294/64.3

(Continued)

FOREIGN PATENT DOCUMENTS

JP H01127538 5/1989
JP H06321351 11/1994
(Continued)

OTHER PUBLICATIONS

"International Search Report (Form PCT/ISA/210) of PCT/JP2020/016291," mailed on Jun. 23, 2020, with English translation thereof, pp. 1-5.
(Continued)

*Primary Examiner* — Dean J Kramer
(74) *Attorney, Agent, or Firm* — JCIPRNET (57) ABSTRACT

This conveying device 1 comprises: a chuck 2 that contactlessly holds a semiconductor chip 103 to face a holding surface 2B; and a guide 3 that has a guide probe 9 capable of abutting a chip side surface 103s of the semiconductor chip 103, and for the semiconductor chip 103 held by the chuck 2, the guide probe 9 limits the movement of the semiconductor chip 103 in the lateral direction which intersects a normal N to the holding surface 2B. The guide probe 9 is capable of reciprocating movement in which a probe tip 9a moves towards and away from the holding surface 2B.

5 Claims, 8 Drawing Sheets (58) Field of Classification Search
USPC .............................................. 294/64.3, 185
See application file for complete search history.

(56) References Cited

U.S. PATENT DOCUMENTS

2017/0200631 A1* 7/2017 Suezaki .............. H01L 31/1884
2020/0258768 A1   8/2020 Tomita et al.

FOREIGN PATENT DOCUMENTS

| JP | 3122750    | 6/2006  |
| JP | 2007109748 | 4/2007  |
| JP | 4766824    | 9/2011  |
| JP | 2012099755 | 5/2012  |
| JP | 2012183620 | 9/2012  |
| JP | 2014003238 | 1/2014  |
| JP | 2014165470 | 9/2014  |
| KR | 20110125062| 11/2011 |
| TW | 201908538  | 3/2019  |

OTHER PUBLICATIONS

"Office Action of China Counterpart Application", with English translation thereof, issued on Sep. 10, 2024, p. 1-p. 15.

* cited by examiner

CONVEYING DEVICE

CROSS-REFERENCE TO RELATED APPLICATION

This application is a 371 application of the International PCT application serial no. PCT/JP2020/016291, filed on Apr. 13, 2020, which claims the priority benefits of Japan Patent Application No. 2019-076885, filed on Apr. 15, 2019. The entirety of each of the above-mentioned patent applications is hereby incorporated by reference herein and made a part of this specification.

BACKGROUND

Technical Field

The present invention relates to a conveying device.

Description of Related Art

A semiconductor chip obtained by dicing a semiconductor wafer is a component for an electronic device. A process of manufacturing the semiconductor chip includes the work of moving the semiconductor wafer. Further, the process of manufacturing the electronic device includes the work of picking up the semiconductor chip and the work of arranging the semiconductor chip on a circuit board. The semiconductor wafer and the semiconductor chip need to be kept in a clean state. Therefore, it is desirable that the semiconductor wafer and the semiconductor chip are not directly touched in these works. For example, Patent Documents 1 to 3 disclose techniques for holding a semiconductor wafer, etc. in a non-contact manner.

RELATED ART

Patent Documents

[Patent Document 1] Japanese Laid-Open No. 2014-003238
[Patent Document 2] Japanese Laid-Open No. 2014-165470
[Patent Document 3] Japanese Laid-Open No. 01-127538

SUMMARY

Problems to be Solved

A so-called Bernoulli chuck is known as a technique for holding an object in a non-contact manner. The Bernoulli chuck utilizes a force generated by flowing a fluid between the chuck and the object. This force pulls the object to the chuck. The pulling force is called a holding force. However, the Bernoulli chuck does not exert any binding force on the object in a lateral direction that intersects the direction of the holding force. As a result, when a force in the lateral direction acts on the object in a state where the object is held by the chuck, the object may easily move. As a result, it is difficult to pick up the object stably.

The present invention provides a conveying device that can pick up the object stably.

Means for Solving the Problems

A conveying device according to an embodiment of the present invention includes: a chuck part holding an object, which is a semiconductor chip or a semiconductor wafer, in a non-contact manner to face a holding surface; and a guide part having a guide probe capable of abutting a side surface of the object and, for the object held by the chuck part, the guide probe limits movement of the object in a lateral direction that intersects a direction of a normal of the holding surface. The guide probe is capable of performing reciprocating movement in which a tip of the guide probe moves toward and away from the holding surface.

The guide probe of the guide part provided in the conveying device limits the movement of the object held by the chuck in the lateral direction. The guide probe can move to be close to and move away from the holding surface of the chuck. Then, when the object is brought close to the chuck, the guide probe moves to be close to the holding surface of the chuck. Therefore, the chuck can be easily brought close to the object regardless of the surrounding conditions of the object. Then, when the chuck holding the object is lifted, the guide probe moves away from the holding surface. As a result, the guide probe exists on the side surface of the object. Therefore, the movement of the object in the lateral direction is limited. That is, it is possible to both limit the movement of the object in the lateral direction and lift the object. Therefore, the object can be picked up stably.

The guide probe of the conveying device may switch between a first form in which a distance from the tip of the guide probe to the holding surface is a first distance, and a second form in which the distance from the tip of the guide probe to the holding surface is a second distance, and the second distance may be shorter than the first distance. According to this configuration, the reciprocating movement in which the tip of the guide probe moves toward and away from the holding surface can be reliably performed.

The guide probe of the conveying device may extend in the direction of the normal. According to this configuration, the configuration of the guide part can be simplified.

The guide part of the conveying device may include an urging force generating part that provides an urging force toward the direction of the normal to the guide probe. According to this configuration, the operation of moving the tip of the guide probe away from the holding surface can be reliably performed.

At least two guide parts of the conveying device may be arranged along a first edge of the holding surface. At least two other guide parts may be arranged along a second edge of the holding surface. According to these configurations, the two guide parts are capable of abutting the side surface of the object. As a result, the rotational movement of the object is preferably limited. Therefore, the object can be picked up more stably.

The guide part of the conveying device may include a first guide probe that extends in a direction inclined with respect to the direction of the normal. Another guide part may include a second guide probe that extends in a direction inclined with respect to the direction of the normal. A separation width between a tip of the first guide probe and a tip of the second guide probe may be larger than a separation width between a base end of the first guide probe and a base end of the second guide probe. According to these configurations, the object can be picked up even when the position of the chuck is displaced with respect to the object.

The chuck part of the conveying device may be a Bernoulli chuck. According to this configuration, the object can be reliably held in a non-contact manner.

Effects

The conveying device according to an embodiment of the present invention can pick up the object stably.

DESCRIPTION OF THE EMBODIMENTS

Hereinafter, embodiments for carrying out the present invention will be described in detail with reference to the accompanying drawings. In the description of the drawings, the same elements are assigned with the same reference numerals, and the repeated description will be omitted.

Figure 1:
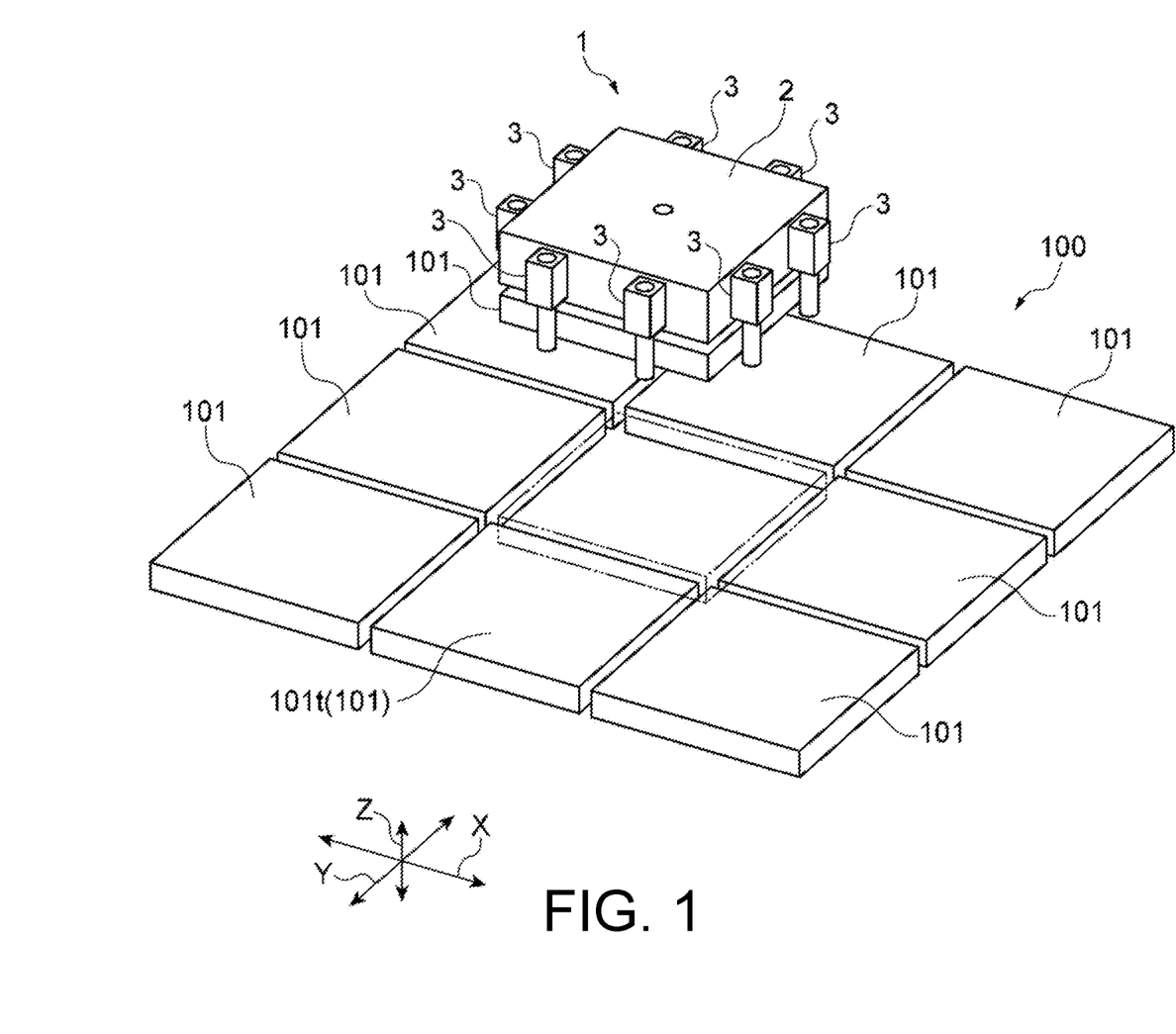
FIG. 1 is a perspective view showing a state where a conveying device of an embodiment picks up a semiconductor chip.

As shown in FIG. 1, a semiconductor wafer 100 that has been diced has a plurality of semiconductor chips 101. An interval between the semiconductor chips 101 is at least equivalent to a thickness of a dicing cutter. As an example, the interval between the semiconductor chips 101 is about 100 micrometers. For the semiconductor chip 101, it is desirable to avoid contact with a chip main surface 101t in order to maintain cleanness. Therefore, the conveying device 1 of the embodiment picks up the semiconductor chip 101 as an object one by one without touching the chip main surface 101t of the semiconductor chip 101. When other semiconductor chips 101 are arranged all around the semiconductor chip 101 to be picked up, the conveying device 1 can still pick up the semiconductor chip 101 to be picked up. When other semiconductor chips 101 are arranged partially around the semiconductor chip 101 to be picked up, such as in a peripheral portion of the semiconductor wafer 100, the conveying device 1 can still pick up the semiconductor chip 101 to be picked up.

The conveying device 1 for conveying the semiconductor chip 101 may be used, for example, in a die bond apparatus and a pickup apparatus.

Figure 2:
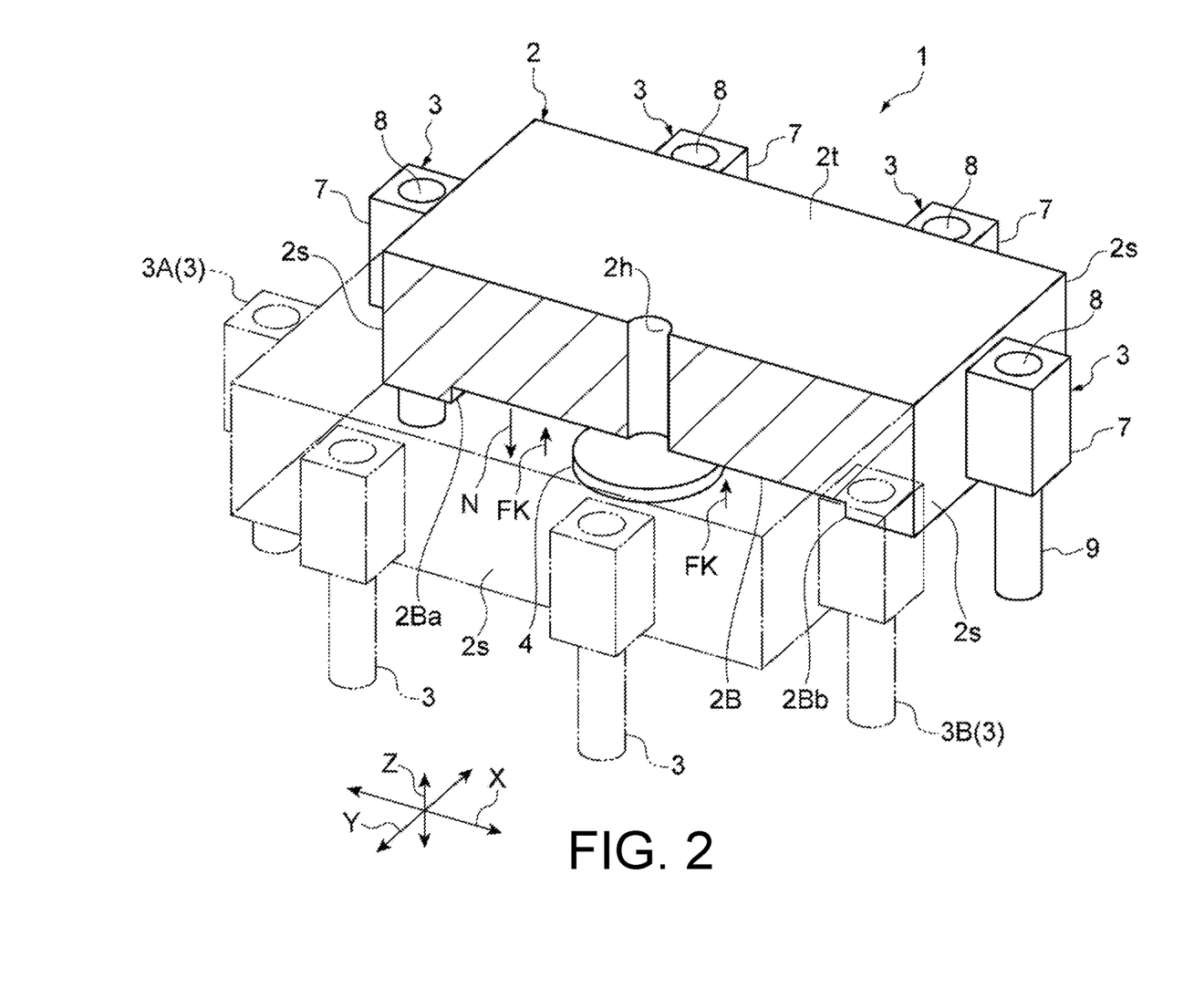
FIG. 2 is a perspective view showing a configuration of the conveying device.

As shown in FIG. 2, the conveying device 1 includes a chuck 2 (chuck part) and guides 3 (guide parts). The chuck 2 generates a holding force FK for holding the semiconductor chip 101 on a holding surface 2B. The holding force FK is based on, for example, the effect of Bernoulli. The chuck 2 is a so-called Bernoulli chuck. The chuck 2 has an air hole 2h. Compressed air for generating the holding force FK is supplied to the air hole 2h. The air hole 2h has an opening formed on a chuck main surface 2t and an opening formed on the holding surface 2B of the chuck 2. A control plate 4 for controlling the flow of air may be provided in the vicinity of the opening on the side of the holding surface 2B. The compressed air supplied from the chuck main surface 2t is ejected from the opening on the holding surface 2B which is a lower surface of the chuck. The control plate 4 controls a direction of the compressed air. As a result, the compressed air flows in a direction along the holding surface 2B. Then, the compressed air flows out from the side of a chuck side surface 2s to the surroundings.

The configuration of the chuck 2 is not limited to the above configuration, and a configuration capable of holding the semiconductor chip 101 in a non-contact manner may be adopted.

The holding force FK of the chuck 2 is along a direction of a normal N of the holding surface 2B. The direction of the holding force FK is opposite to the direction of the normal N. That is, the direction of the holding force FK is toward the holding surface 2B. When the semiconductor chip 101 is held by the holding force FK, the semiconductor chip 101 is not constrained in an X direction which is a lateral direction that intersects the normal N. Therefore, when a force in the X direction acts on the semiconductor chip 101, the semiconductor chip 101 easily moves in the X direction. Similarly, the semiconductor chip 101 is not constrained in a Y direction which is another lateral direction that intersects the normal N. Therefore, when a force in the Y direction acts on the semiconductor chip 101, the semiconductor chip 101 easily moves in the Y direction.

Thus, the guides 3 regulate the movement in the lateral direction. The lateral direction includes the X direction and the Y direction. The conveying device 1 includes eight guides 3. When a planar shape of the chuck 2 is rectangular as viewed from the direction of the normal N, two guides 3 are arranged on each chuck side surface 2s. In other words, two guides 3 are arranged along a first edge 2Ba of the holding surface 2B. Further, two other guides 3 are arranged along a second edge 2Bb of the holding surface 2B. The plurality of guides 3 differ from each other only in the positions where they are arranged, and the individual configurations are the same. Hereinafter, the detailed configuration thereof will be described with reference to the guide 3A as an example, and the description of the other guides 3 will be omitted.

Figure 3:
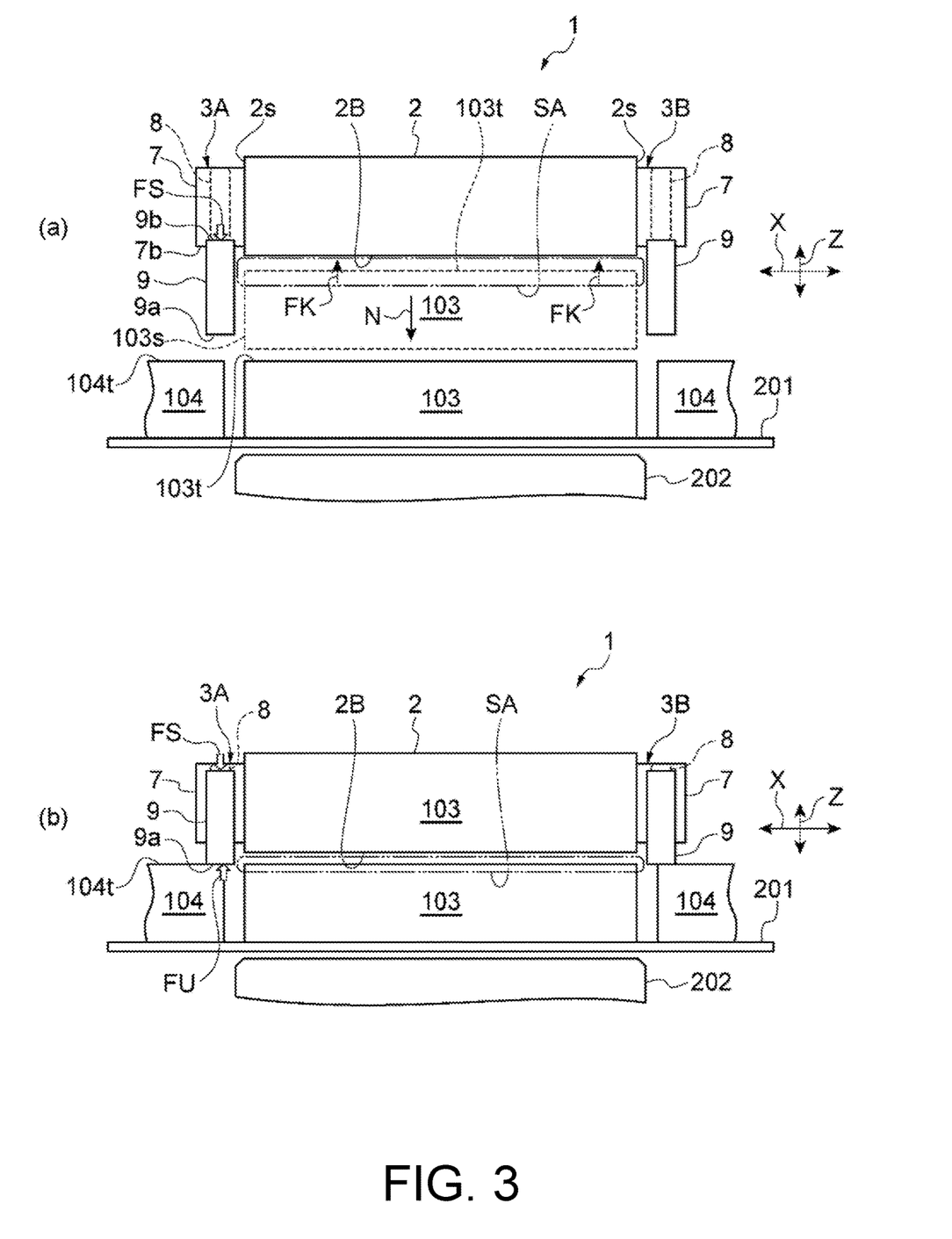
FIG. 3 includes views showing an end surface of the conveying device.
Figure 4:
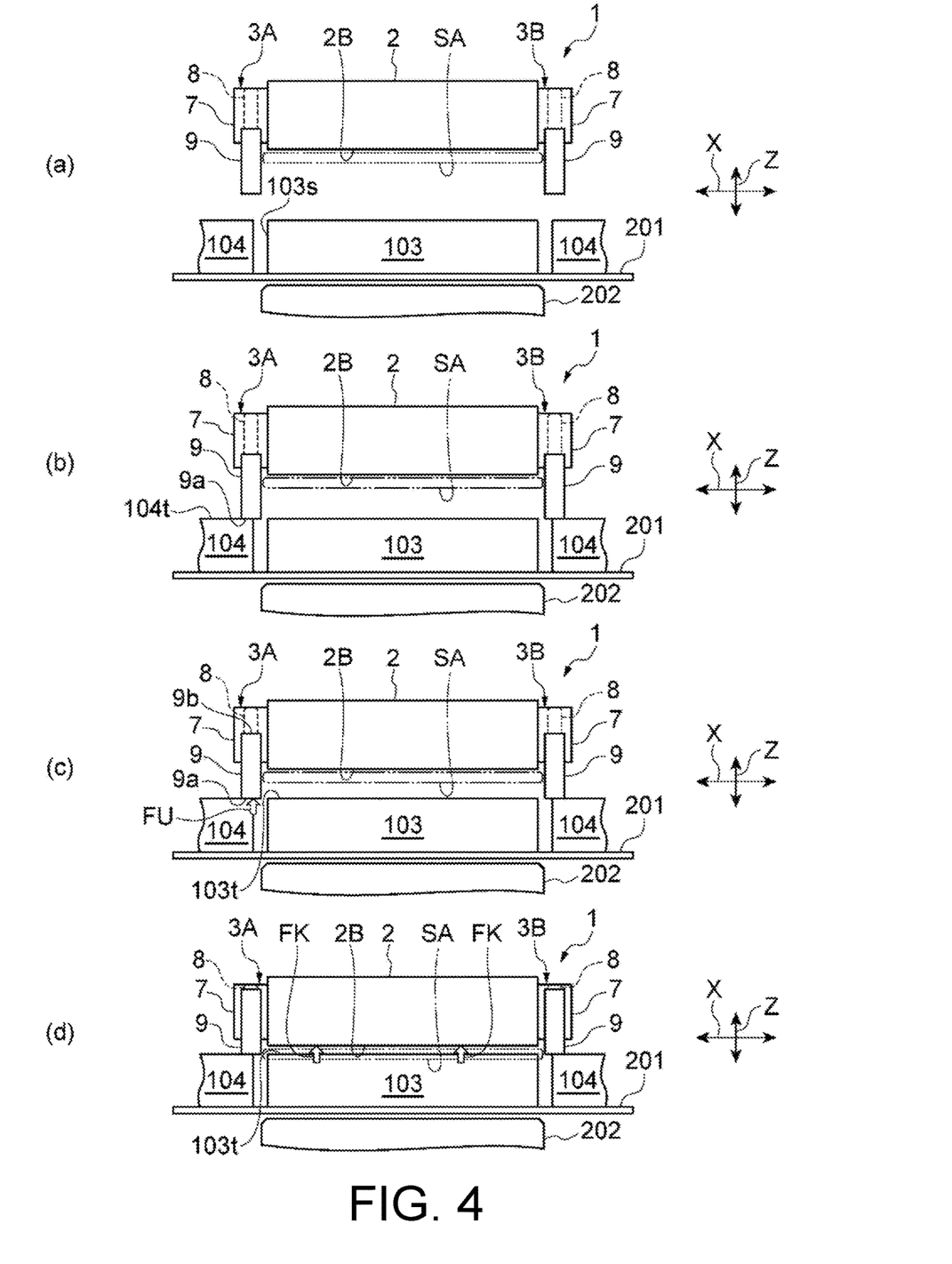
FIG. 4 includes views showing an operation of picking up a semiconductor chip by using the conveying device of FIG. 2.
Figure 5:
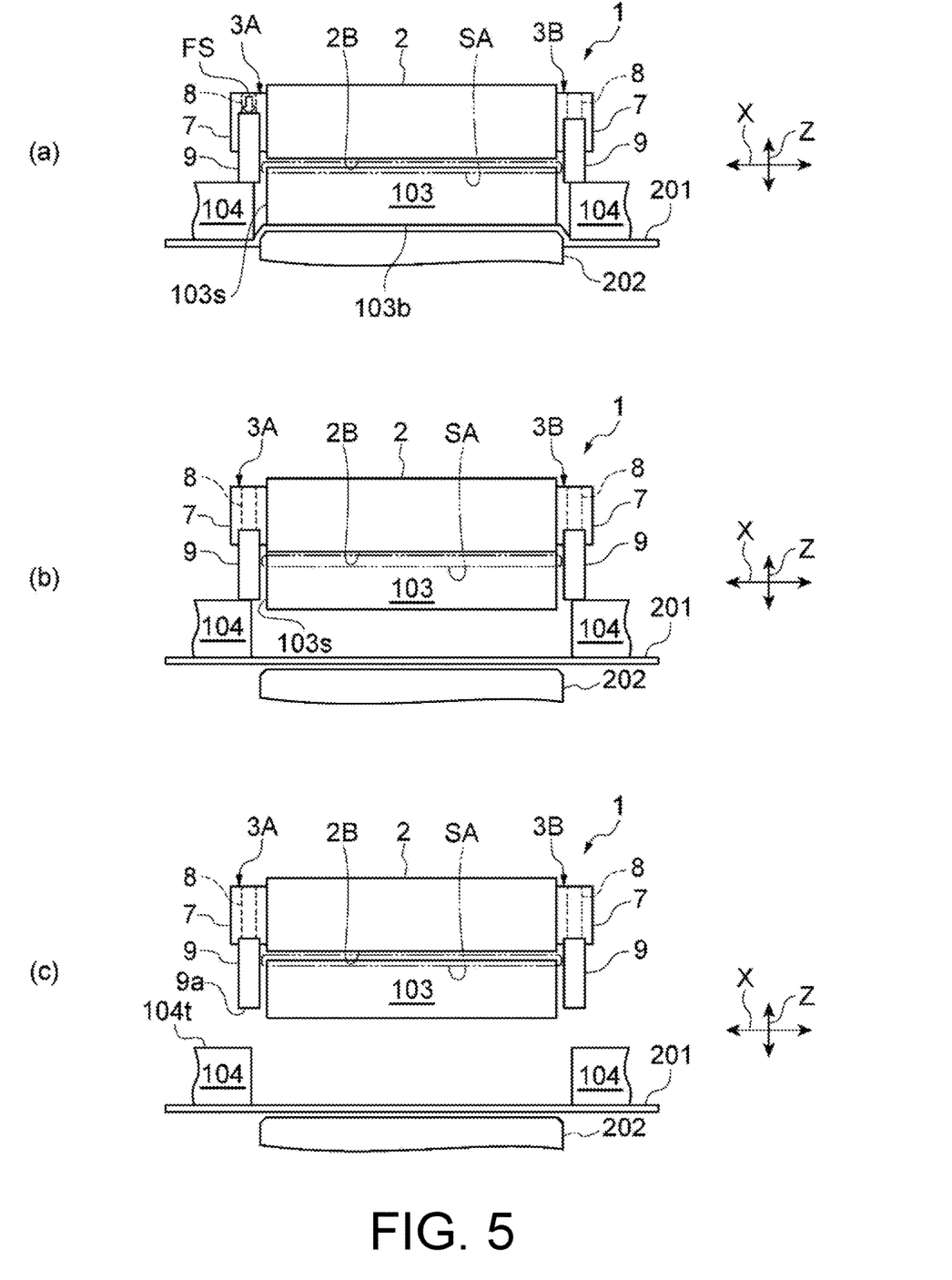
FIG. 5 includes views showing an operation of picking up the semiconductor chip by using the conveying device, following FIG. 4.

As shown in the part (a) of FIG. 3, the guide 3A has a guide main body 7, a spring 8, and a guide probe 9. FIG. 3, FIG. 4, and FIG. 5 show only a pair of guides 3A and 3B, and the other guides 3 are omitted. The guide main body 7 is fixed to the chuck side surface 2s. The guide main body 7 accommodates the spring 8 and a probe base end 9b. The position of a guide lower surface 7b of the guide main body 7 is above the position of the holding surface 2B of the chuck 2. In other words, the guide lower surface 7b does not protrude from the holding surface 2B. The guide lower surface 7b may be on the same plane as (flush with) the holding surface 2B. Further, the guide lower surface 7b does not protrude from at least a holding force acting region SA.

The guide probe 9 is capable of performing reciprocating movement with respect to the guide main body 7 in an axial direction of the guide probe 9. That is, the guide probe 9 is capable of performing reciprocating movement with respect to the chuck 2 along the normal N of the holding surface 2B. The spring 8 is accommodated in the guide main body 7. The spring 8 applies an urging force FS along the normal N to the guide probe 9. The spring 8 is a compression spring. The upper end of the spring 8 is fixed to the guide main body 7. The lower end of the spring 8 is fixed to the guide probe 9. In the initial state, the spring 8 is slightly shorter than the natural length. According to the state of being slightly shorter than the natural length, in the initial state, the spring 8 applies the urging force FS that presses the guide probe 9 downward to the guide probe 9. Therefore, the guide probe 9 can be reliably protruded. The distance from the holding surface 2B to a probe tip 9a in this state is a first distance.

As shown in the part (b) of FIG. 3, when the probe tip 9a comes into contact with a chip main surface 104t, the guide probe 9 receives an upward reaction force FU. When the upward reaction force FU acts on the guide probe 9, the spring 8 is compressed. As a result, the spring 8 becomes shorter. That is, the guide probe 9 is allowed to move upward. Then, as shown in the part (a) of FIG. 3, the probe tip 9a is separated from the chip main surface 104t. As a result, the upward reaction force FU acting on the guide probe 9 disappears. Therefore, the guide probe 9 is pressed downward by the urging force FS of the spring 8.

The guide 3 may adopt a configuration capable of exerting the urging force FS as an urging force generating part. For example, the guide 3 may use an air cylinder as the urging force generating part. Further, the guide 3 may omit the urging force generating part if necessary.

Based on the above operation, the guide probe 9 may take a first form and a second form that can be switched. The first form refers to a state in which the movement of the held semiconductor chip 101 in the lateral direction can be regulated (see the part (a) of FIG. 3). In the first form, the position of the probe tip 9a of the guide probe 9 is at least below the holding force acting region SA. It suffices if the held semiconductor chip 101 is regulated in the lateral direction. At least, the position of the probe tip 9a is below the chip main surface 103t of the semiconductor chip 101 in the held state. That is, the guide probe 9 overlaps with the chip side surface 103s of the semiconductor chip 103. The first form can be taken in a process of approaching the semiconductor chip 101 (for example, the part (c) of FIG. 4). Further, the first form can be taken in a process of holding the semiconductor chip 101 and then moving it above the semiconductor wafer 100 (for example, the part (a) of FIG. 5). In other words, the first form does not include a moment when the chuck 2 switches from the state in which the holding force FK is not applied to the semiconductor chip 103 to the state in which the holding force FK is applied (see, for example, the part (b) of FIG. 3). In this period, the guide probe 9 takes the second form described below.

The second form is a state in which the guide probe 9 is contracted most. In other words, it can be said that the distance from the probe tip 9a to the holding surface 2B is the shortest. The distance from the holding surface 2B to the probe tip 9a in this state is a second distance. In this state, the probe tip 9a overlaps with the holding force acting region SA. That is, in the state where the guide probe 9 is contracted most, the position of the probe tip 9a is on the side of the holding surface 2B with respect to the lower end of the holding force acting region SA.

Hereinafter, an operation of picking up the semiconductor chip 103 by using the conveying device 1 will be described with reference to FIG. 4 and FIG. 5.

First, as shown in the part (a) of FIG. 4, the conveying device 1 is moved to be directly above the semiconductor chip 103 to be picked up. At this time, the position of the guide probe 9 is outside the chip side surface 103s of the semiconductor chip 103.

Next, as shown in the part (b) of FIG. 4, the conveying device 1 is brought close to the semiconductor chip 103. As a result, the probe tip 9a comes into contact with the chip main surface 104t of another semiconductor chip 104 adjacent to the semiconductor chip 103, respectively. In this state, the holding force acting region SA of the chuck 2 does not overlap with the semiconductor chip 103. Therefore, the chuck 2 cannot hold the semiconductor chip 103.

Next, as shown in the part (c) of FIG. 4, the conveying device 1 is further brought close to the semiconductor chip 103. More specifically, the holding surface 2B is brought close to the chip main surface 103t. Then, the probe tip 9a receives the reaction force FU from the semiconductor chip 104. Therefore, as the chuck 2 approaches the semiconductor chip 103, the spring 8 is contracted. In parallel with this operation, the probe base end 9b is accommodated inside the guide main body 7. In other words, the guide probe 9 does not move, but the chuck 2 and the guide main body 7 move downward with respect to the stationary guide probe 9. Even in this state, the holding force acting region SA of the chuck 2 does not overlap with the semiconductor chip 103. Therefore, the chuck 2 cannot hold the semiconductor chip 103.

Next, as shown in the part (d) of FIG. 4, the conveying device 1 is further brought close to the semiconductor chip 103. More specifically, the holding surface 2B is brought close to the chip main surface 103t. As a result, the holding force acting region SA overlaps with the chip main surface 103t. In this state, the holding force FK of the chuck 2 acts on the semiconductor chip 103. Then, compressed air is supplied to the chuck 2. As a result, the holding force FK is generated. Therefore, the semiconductor chip 103 is held by the chuck 2.

Next, as shown in the part (a) of FIG. 5, the conveying device 1 is moved away from a dicing tape 201. In other words, the chuck 2 of the conveying device 1 is moved upward (Z direction). Along with this movement, the semiconductor chip 103 moves upward. Then, the guide probe 9 keeps being pressed against the semiconductor chip 104 by the urging force FS of the spring 8. That is, the chuck 2 and the guide main body 7 move upward, but the guide probe 9 keeps its position. Then, as the chuck 2 rises, the guide probe 9 accommodated in the guide main body 7 seems to extend. Therefore, in this period, as the semiconductor chip 103 rises, an overlapping portion between the chip side surface 103s of the semiconductor chip 103 and the guide probe 9 is formed. That is, as the semiconductor chip 103 rises, the function of suppressing the displacement of the semiconductor chip 103 in the lateral direction is exhibited. In particular, while a chip back surface 103b of the semiconductor chip 103 is peeled from the dicing tape 201, partial peeling occurs irregularly. As a result, an unintended external force tends to act on the semiconductor chip 103. However, the guide probe 9 already exists on the lateral side of the semiconductor chip 103. That is, the displacement of the semiconductor chip 103 in the lateral direction can be suppressed.

The semiconductor chip 103 may be pushed up by using a pickup pin 202 arranged on the back surface side of the dicing tape 201. Further, the chip main surface 103t of the semiconductor chip 103 may reach the holding force acting region SA by pushing up the pickup pin 202.

Next, as shown in the part (b) of FIG. 5, the chuck 2 of the conveying device 1 is moved upward. Along with this movement, the semiconductor chip 103 moves further upward. While the semiconductor chip 103 is moving, the overlapping region between the chip side surface 103s and the guide probe 9 increases as described above. Then, the positional relationship between the chuck 2 and the guide probe 9 returns to the first form. In this state, the length of the guide probe 9 is the maximum.

Then, as shown in the part (c) of FIG. 5, the chuck 2 of the conveying device 1 is further moved upward. Along with this movement, the semiconductor chip 103 moves further upward. Further, the length of the guide probe 9 is the maximum. That is, the relative position of the guide probe 9 with respect to the chuck 2 does not change. Therefore, the guide probe 9 moves upward along with the movement of the chuck 2. As a result, the probe tip 9a is separated from the chip main surface 104t of the semiconductor chip 104.

Through the above operation, the conveying device 1 picks up the semiconductor chip 103.

The conveying device 1 includes the chuck 2 and the guides 3. The chuck 2 holds the semiconductor chip 103 in a non-contact manner to face the holding surface 2B. The guide 3 has the guide probe 9 capable of abutting the chip side surface 103s of the semiconductor chip 103. For the semiconductor chip 103 held by the chuck 2, the guide probe 9 limits the movement of the semiconductor chip 103 in the lateral direction that intersects the direction of the normal N of the holding surface 2B. The guide probe 9 is capable of performing reciprocating movement in which the probe tip 9a moves toward and away from the holding surface 2B.

The guide probe 9 of the guide 3 included in the conveying device 1 limits the movement of the semiconductor chip 103 held by the chuck 2 in the lateral direction. The guide probe 9 is capable of moving toward and moving away from the holding surface 2B of the chuck 2. Then, when the chuck 2 is brought close to the semiconductor chip 103, the guide probe 9 can move to be close to the holding surface 2B. Therefore, even when other semiconductor chips 104 exist around the semiconductor chip 103, the chuck 2 can be easily brought close to the semiconductor chip 103. Then, when the chuck 2 holding the semiconductor chip 103 is lifted, the guide probe 9 moves to be away from the holding surface 2B of the chuck 2. As a result, the guide probe 9 exists on the chip side surface 103s of the semiconductor chip 103. Therefore, the movement of the semiconductor chip 103 in the lateral direction is limited. That is, the conveying device 1 can both limit the movement of the semiconductor chip 103 in the lateral direction and lift the semiconductor chip 103. Therefore, the semiconductor chip 103 can be picked up stably.

Figure 8:
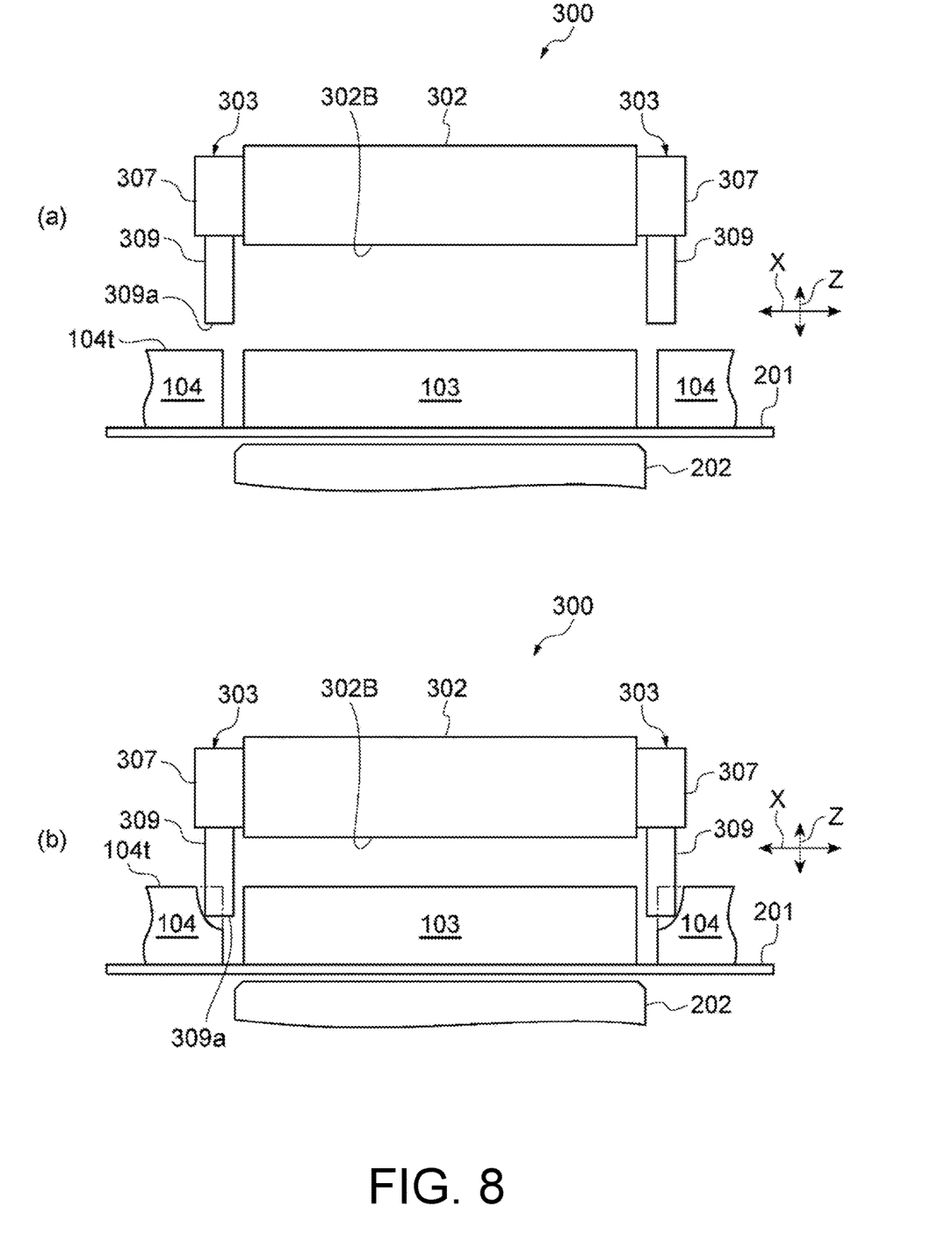
FIG. 8 includes views showing an operation of picking up a semiconductor chip by using a conveying device of a comparative example.

For example, unlike the conveying device 1, the guide probe 309 of the guide 303 of the conveying device 300 according to the comparative example shown in the part (a) of FIG. 8 is fixed to the guide main body 307. According to this configuration, when the holding surface 302B of the chuck 302 is brought close to the semiconductor chip 103, the probe tip 309a is pressed against the chip main surface 104t of another semiconductor chip 104 adjacent to the semiconductor chip 103. In the conveying device 300 of the comparative example, the guide probe 309 does not expand and contract. Therefore, when the chuck 302 is further brought close to the semiconductor chip 103, the force with which the probe tip 309a presses the chip main surface 104t further increases, as shown in the part (b) of FIG. 8. As a result, the semiconductor chip 104 may be damaged.

On the other hand, when the chuck 2 is brought close to the semiconductor chip 103, the conveying device 1 moves so that the probe tip 9a approaches the holding surface 2B. Therefore, unlike the conveying device 300 of the comparative example, the pressing force on the chip main surface 104t is suppressed from increasing with the approach of the chuck 2. Therefore, the conveying device 1 does not damage the semiconductor chip 104.

The guide probe 9 of the conveying device 1 switches between the first form in which the distance from the probe tip 9a to the holding surface 2B is the first distance and the second form in which the distance from the probe tip 9a to the holding surface 2B is the second distance. The second distance is shorter than the first distance. According to this configuration, the reciprocating movement in which the probe tip 9a moves toward and away from the holding surface 2B can be reliably performed.

The guide probe 9 of the conveying device 1 extends in the direction of the normal N. According to this configuration, the configuration of the guide 3 can be simplified.

The guide 3 of the conveying device 1 has the spring 8. The spring 8 provides the guide probe 9 with the urging force FS in the direction of the normal N. According to this configuration, the operation of moving the tip of the guide probe 9 away from the holding surface 2B can be reliably performed.

Two guides 3 of the conveying device 1 are arranged along the first edge 2Ba of the holding surface 2B. At least two other guides 3 of the conveying device 1 are arranged along the second edge 2Bb of the holding surface 2B. According to this configuration, the two guides 3 are capable of abutting the chip side surface 103s of the semiconductor chip 103. As a result, the rotational movement of the semiconductor chip 103 is preferably limited. Therefore, the semiconductor chip 103 can be picked up more stably.

The conveying device 1 of the present disclosure has been described above. However, the conveying device 1 of the present disclosure is not limited to the above-described embodiment and may be implemented in various forms.

Figure 6:
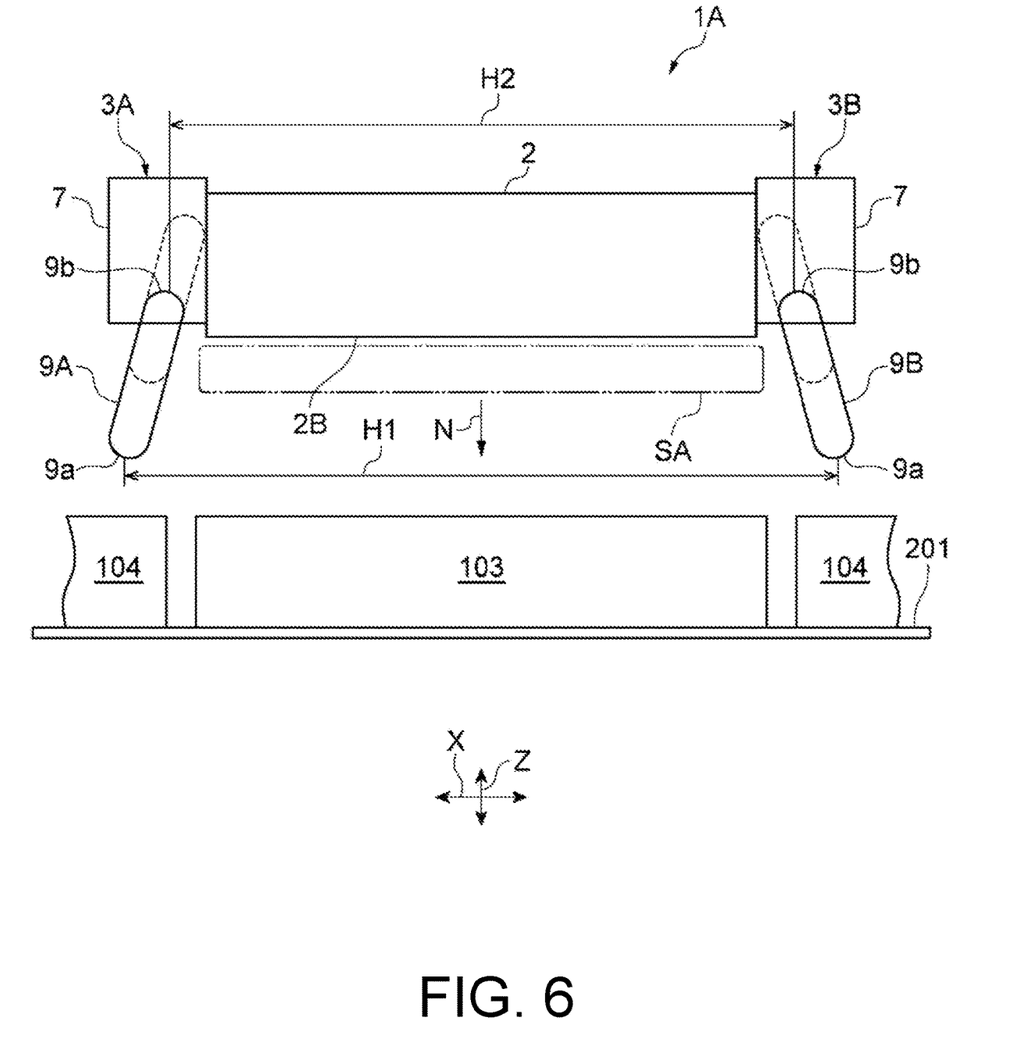
FIG. 6 is a view showing a conveying device of the first modification.

For example, the conveying device 1A shown in FIG. 6 has guides 3A and 3B. The guide probes 9A and 9B (first guide probe and second guide probe) of the guides 3A and 3B may be inclined with respect to the normal N of the holding surface 2B. The guide probes 9A and 9B expand and contract with respect to the guide main body 7 in a direction inclined with respect to the normal N. The guide probes 9A and 9B may move along the direction of the normal N. That is, it suffices if the relative positional relationship of the probe tip 9a with respect to the chuck 2 is variable. Although the spring 8 is not shown in FIG. 6, the guides 3A and 3B may or may not have the spring 8.

Here, a separation width H1 from the probe tip 9a of the guide probe 9A to the probe tip 9a of the guide probe 9B is larger than a separation width H2 from the probe base end 9b of the guide probe 9A to the probe base end 9b of the guide probe 9B. In other words, the separation width from the guide probe 9A to the guide probe 9B increases as they go from the holding surface 2B.

In short, the guides 3A and 3B of the conveying device 1A have the guide probes 9A and 9B that extend in the direction inclined with respect to the direction of the normal N. The separation width H1 from the probe tip 9a of the guide probe 9A to the probe tip 9a of the guide probe 9B is larger than the separation width H2 from the probe base end 9b of the guide probe 9A to the probe base end 9b of the guide probe 9B. According to this configuration, the semiconductor chip 103 can be picked up even when the position of the chuck 2 is displaced with respect to the semiconductor chip 103.

That is, even if the positions of the conveying device 1A and the semiconductor chip 103 to be picked up are slightly displaced, the conveying device 1A can still guide the semiconductor chip 103 to a predetermined holding position. Therefore, the conditions of the position where the semiconductor chip 103 can be held can be relaxed. As a result, the conveying device 1A can hold the semiconductor chip 103 more stably.

Figure 7:
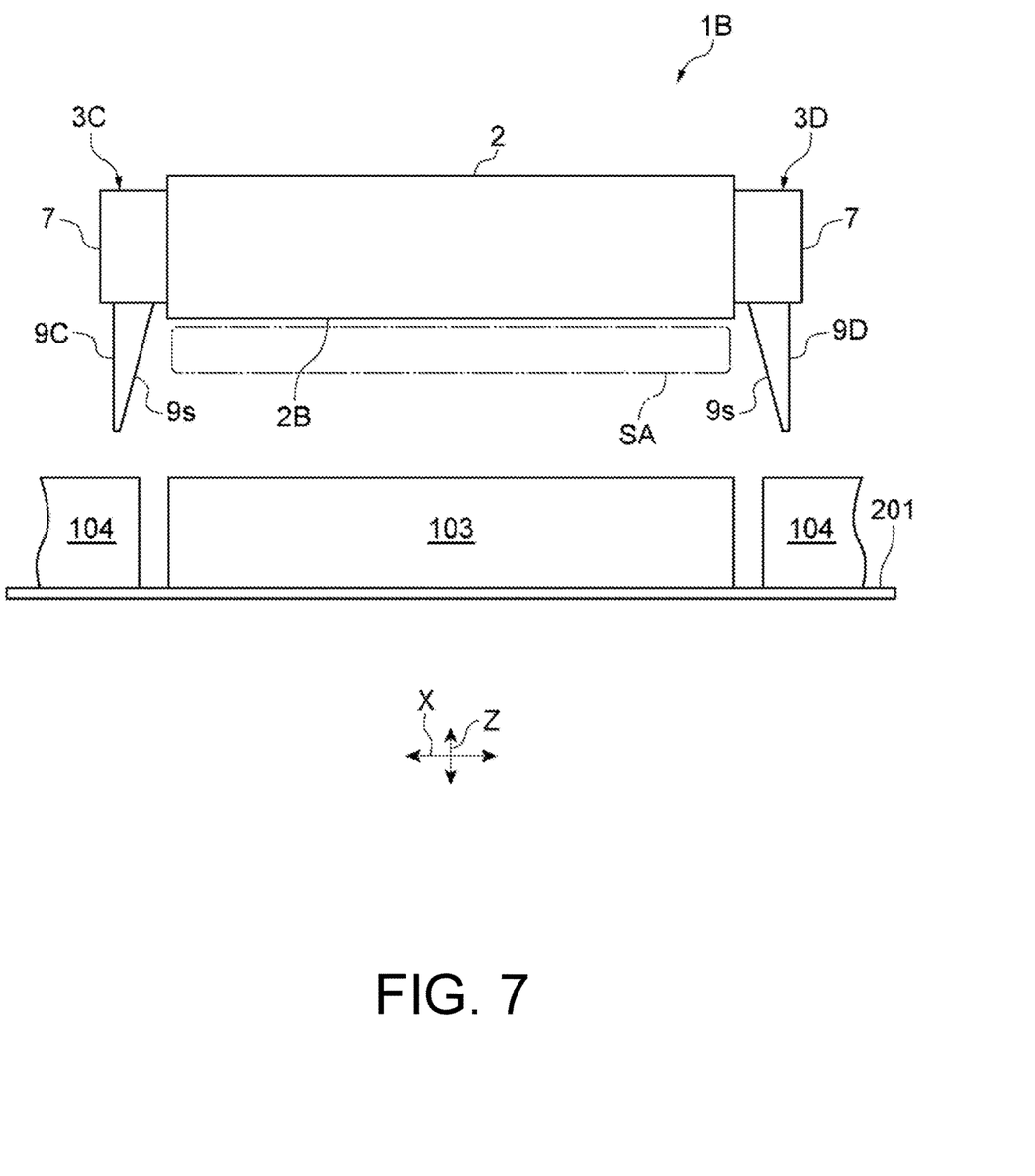
FIG. 7 is a view showing a conveying device of the second modification.

The mechanism that allows the horizontal displacement of the semiconductor chip with respect to the conveying device can also be realized by a mechanism different from the mechanism shown in FIG. 6. For example, as shown in FIG. 7, the guide probes 9C and 9D of the guides 3C and 3D have inclined probe side surfaces 9s. In other words, the shapes of the guide probes 9C and 9D are tapered. With such a configuration, even if the position of the semiconductor chip 103 to be picked up is slightly displaced with respect to the conveying device 1B, the semiconductor chip 103 can still be guided to the predetermined holding position.

The conveying device 1 of the embodiment is applied to convey the semiconductor chip 103. The conveying device may also be applied to convey a semiconductor wafer.

What is claimed is:

1. A conveying device, comprising:
   a chuck part configured to hold an object, which is a semiconductor chip or a semiconductor wafer, in a non-contact manner to face a holding surface; and
   guide parts having a plurality of guide probes that are columnar and capable of abutting a side surface of the object at intervals and, for the object held by the chuck part, the guide probes limiting movement of the object in a lateral direction that intersects a direction of a normal of the holding surface,
   wherein each of the guide probes is capable of performing reciprocating movement in which a tip of corresponding one of the guide probes expands and contracts with respect to the holding surface,
   the guide probes comprise a first guide probe provided on a guide part and extending in a direction inclined with respect to the direction of the normal, and a second guide probe provided on another guide part and extending in a direction inclined with respect to the direction of the normal,
   a separation width between a tip of the first guide probe and a tip of the second guide probe is larger than a separation width between a base end of the first guide probe and a base end of the second guide probe, and
   the tip of the first guide probe and the tip of the second guide probe are rounded.

2. The conveying device according to claim 1, wherein each of the guide probes switches between a first form in which a distance from the tip of corresponding one of the guide probes to the holding surface is a first distance, and a second form in which the distance from the tip of the corresponding one of the guide probes to the holding surface is a second distance, and
   the second distance is shorter than the first distance.

3. The conveying device according to claim 2, wherein at least two guide parts are arranged along a first edge of the holding surface, and
   at least two other guide parts are arranged along a second edge of the holding surface.

4. The conveying device according to claim 1, wherein at least two guide parts are arranged along a first edge of the holding surface, and
   at least two other guide parts are arranged along a second edge of the holding surface.

5. The conveying device according to claim 1, wherein the chuck part is a Bernoulli chuck.

* * * * *